United States Patent
Ott et al.

(10) Patent No.: US 7,892,370 B2
(45) Date of Patent: Feb. 22, 2011

(54) HEAT TREATMENT METHOD FOR MONOCRYSTALLINE OR DIRECTIONALLY SOLIDIFIED STRUCTURAL COMPONENTS

(75) Inventors: Michael Ott, Mülheim an der Ruhr (DE); Uwe Paul, Ratingen (DE)

(73) Assignee: Siemens Aktiengesellschaft, Munich (DE)

( * ) Notice: Subject to any disclaimer, the term of this patent is extended or adjusted under 35 U.S.C. 154(b) by 696 days.

(21) Appl. No.: 11/587,897

(22) PCT Filed: Apr. 28, 2005

(86) PCT No.: PCT/EP2005/051918

§ 371 (c)(1),
(2), (4) Date: Jan. 28, 2008

(87) PCT Pub. No.: WO2005/106062

PCT Pub. Date: Nov. 10, 2005

(65) Prior Publication Data

US 2008/0202650 A1     Aug. 28, 2008

(30) Foreign Application Priority Data

Apr. 30, 2004    (EP)    .................... 04010317

(51) Int. Cl.
  *C21D 1/00*     (2006.01)
  *C30B 33/00*   (2006.01)
(52) U.S. Cl. .............. 148/714; 148/404; 148/562
(58) Field of Classification Search ............... 148/404, 148/409, 410, 562, 567, 574, 677, 714, 902; 219/600–635; 266/124, 134, 258
See application file for complete search history.

(56) References Cited

U.S. PATENT DOCUMENTS 4,385,939 A    5/1983    Kortovich, Jr. et al.
5,413,648 A    5/1995    Salkeld et al.

(Continued)

FOREIGN PATENT DOCUMENTS

EP    1 036 850 A1    9/2000

OTHER PUBLICATIONS

J.M. Svoboda "Nickel and Nickel Alloys", in ASM Handbook, vol. 15, published May 1992, pp. 815-818.*
Zhang et al., Factors Effecting the Properties of Stress Rupture at Elevated Temperature in a Single Crystal Ni-Base Superallow, Oct. 1991, pp. 1991, pp. 381-386, vol. 5, No. 5, Materials Science Progress, China Academic Journal Electronic Publishing House.

*Primary Examiner*—George Wyszomierski
*Assistant Examiner*—Mark L Shevin

(57) ABSTRACT

The invention relates to a heat treatment method for monocrystalline or directionally solidified structural components. Said method comprises a heat treatment which results in dissolving at least one crystalline phase of the material of the structural component, referred to in the following as component material. The inventive method is characterized by carrying out the heat treatment by heating the structural component to a dissolution temperature required for dissolving the crystalline phase only in at least one first component area in which the stresses within the component material do not exceed a predetermined value. In at least one second component area in which the stresses within the component material exceed the predetermined value the material is only heated to a temperature below the dissolution temperature.

14 Claims, 2 Drawing Sheets

U.S. PATENT DOCUMENTS

| | | | |
|---|---|---|---|
| 5,527,402 A * | 6/1996 | Ganesh et al. | 148/675 |
| 5,611,670 A | 3/1997 | Yoshinari et al. | |
| 5,822,852 A * | 10/1998 | Bewlay et al. | 29/889.1 |
| 2002/0124915 A1 | 9/2002 | Kobayashi et al. | |
| 2003/0062099 A1 * | 4/2003 | Buergel et al. | 148/276 |
| 2004/0050460 A1 | 3/2004 | Nazmy et al. | |
| 2007/0169860 A1 * | 7/2007 | Groh | 148/675 |
| 2009/0314393 A1 * | 12/2009 | Kelly et al. | 148/574 |

* cited by examiner

US 7,892,370 B2

HEAT TREATMENT METHOD FOR MONOCRYSTALLINE OR DIRECTIONALLY SOLIDIFIED STRUCTURAL COMPONENTS

CROSS REFERENCE TO RELATED APPLICATIONS

This application is the US National Stage of International Application No. PCT/EP2005/051918, filed Apr. 28, 2005 and claims the benefits of European Patent application No. 04010317.8 filed Apr. 30, 2004. All of the applications are incorporated by reference herein in their entirety.

FIELD OF INVENTION

The present invention relates to a heat treatment method for monocrystalline or directionally solidified structural components which results in dissolving at least one crystalline phase of the material.

BACKGROUND OF THE INVENTION

For example, turbine components, such as turbine blades for instance, are produced inter alia from superalloys. Superalloys are nickel- or cobalt-based alloys and typically comprise chromium, titanium, tantalum, aluminum, tungsten and further elements with outstanding resistance to high temperatures and at the same time high strength. An example of a gas turbine blade produced from a superalloy can be taken from U.S. Pat. No. 5,611,670.

The superalloy material has a crystalline structure. As in other crystalline structures, crystal defects may occur in superalloy material. A typical crystal defect is that of grain boundaries, i.e. boundaries between different regions of material which, though they have the same crystalline structure, have a different crystallographic orientation. In directionally solidified structural components, the grain boundaries in the material substantially extend only in one direction, for example in the radial direction of the turbine blade. In monocrystalline materials, on the other hand, there are substantially no grain boundaries.

Structural components of a superalloy such as the said turbine blades are cast and subjected to further working steps after casting. The further working steps comprise a heat treatment to homogenize the material, a so-called solutioning heat treatment, which results inter alia in an increase in the strength of the turbine blade. In addition, the cast turbine blades are also subjected to mechanical working processes. The mechanical working processes thereby cause stresses in the material of the structural components, which may lead during the solutioning heat treatment to the formation of new grains (recrystallization) and consequently to grain boundaries. These grains make the material properties of monocrystalline or directionally solidified structural components deteriorate and, as a result, have an adverse influence on the lifetime of the component. In order to avoid this, the freshly cast structural components are subjected to the heat treatment under an inert gas atmosphere or under a vacuum immediately after the casting process and partial removal of the casting mold. Only after that are the mechanical working processes performed on the component.

If new structural components have to be reworked or structural components that are already in operation have to be repaired, for example by welding or soldering, this may necessitate a renewed heat treatment at the temperature of the solutioning heat treatment or close to this temperature. On account of the stresses that are still present from the mechanical working after the casting process, this may lead to the formation of recrystallized grains. On the other hand, a solutioning heat treatment can increase the service life of the structural components, in particular in the case of components which have already been in operation for a certain amount of time.

SUMMARY OF INVENTION

The object of the present invention is therefore to provide a heat treatment method which has advantageous effects on the microstructure of the material of a structural component and in which at the same time the formation of recrystallized grains is reduced in comparison with the prior-art methods.

This object is achieved by the heat treatment method as claimed in the claims. The dependent claims contain advantageous developments of the heat treatment method according to the invention.

A heat treatment method according to the invention for monocrystalline or directionally solidified structural components comprises a heat treatment which results in dissolving at least one crystalline phase of the material of the structural component, hereafter referred to as component material. The method is distinguished by the fact that, in the heat treatment, heating of the structural component to a dissolution temperature necessary for dissolving the crystalline phase takes place in at least one first component region. In at least one second component region, on the other hand, heating takes place only to a temperature below the dissolution temperature.

The heat treatment method according to the invention for monocrystalline or directionally solidified structural components comprises a heat treatment which results in dissolving at least one crystalline phase of the material of the structural component, hereafter referred to as component material. The method is distinguished, particularly in the case of certain structural components, by the fact that, in the heat treatment, heating of the structural component to a dissolution temperature necessary for dissolving the crystalline phase takes place only in at least one first component region, in which stresses in the component material do not exceed a predetermined value. On the other hand, in at least one second component region, in which stresses in the component material exceed the predetermined value, heating takes place only to a temperature below the dissolution temperature.

The method according to the invention offers the possibility of also subjecting components which have high stresses in some regions and low stresses in other regions to the solutioning heat treatment. For example, the worked blade root of monocrystalline or directionally solidified turbine blades has great internal stresses, which originate from the grinding of the blade root and/or from a shot peening process for working the blade root. On the other hand, on account of its protected position during the operation of the turbine, virtually no deterioration of the microstructure of the superalloy occurs during the operation of the turbine, and also often no significant damage. Therefore, generally no repairs are required on the blade root either. A solutioning heat treatment for reconditioning the component material, i.e. to eliminate effects of aging in the material, is therefore not necessary in the region of the blade root. With the method according to the invention, the heat treatment can therefore be restricted to the region of the blade airfoil and the blade base, at which greater material wear than at the blade root has taken place on account of the operation of the turbine. The temperature of the blade root during the heat treatment is in this case kept in the range below the dissolution temperature by suitable measures.

The heating of the structural component during the heat element according to the invention may be performed in particular by means of induction heating. In order in this case to produce a temperature gradient, i.e. different temperatures for first and second component regions, different induction heating coils are used for first and second component regions. The inductive heating of the structural component makes it possible first to heat a flat surface layer, and so reduce the stresses in the surface to below a value that leads to grain formation being initiated (recrystallization).

Alternatively, the heating of the structural component in the heat treatment method according to the invention may be performed by means of radiant energy sources, for example lamps. For first and second component regions, energy sources (lamps) with different radiant output are then used. The different radiant output may in this case also be realized by different settings of energy sources (lamps) that are in fact identical. Heating by means of radiant energy sources, and in particular by means of lamps, has the advantage that the heating process reacts less sensitively to the atmosphere used during heating, in particular if this atmosphere is an oxidizing atmosphere.

In a third possibility for heating the structural component during the heat treatment according to the invention, the entire component may be exposed to the same heat source. In this case, the second component regions are cooled, or they are insulated, in order to reduce the heat supplied to the second component regions. The cooling or insulating of component regions is suitable in particular for converting already existing heat treatment methods in which the structural components are exposed to one and the same heat source into a heat treatment method according to the invention.

In a development of the heat treatment method according to the invention, the heat treatment takes place under the influence of an oxidizing atmosphere. The oxidizing atmosphere then causes an oxide film to form on the surface of the component while it is being heated, serving as a protective layer that reduces the tendency for recrystallized grains to form. The use of an oxidizing atmosphere is described for example in US 2003/0062099, to the disclosure of which reference is made in this connection. The protection by the oxidizing atmosphere has an effect here in particular on those regions in which the dissolution temperature is reached or exceeded.

In one particular refinement, the heat treatment method according to the invention is designed as a heat treatment method for heat treating a turbine blade. Heating the turbine blade to a dissolution temperature necessary for dissolving the crystalline phase then takes place only in the region of the blade airfoil and the blade base. In the region of the blade root, on the other hand, heating only takes place to a temperature below the dissolution temperature. This refinement is based on the realization that the blade root has high internal stresses in comparison with the blade base and the blade airfoil, but only a slight operationally induced deterioration of the microstructure. In other words, the blade root, in which high internal stresses are present and in which the tendency for recrystallized grains to form is therefore high, but in which on the other hand the necessity for carrying out a solutioning heat treatment is low because of the scarcely deteriorated material properties, is not subjected to solutioning heat treatment. The blade airfoil and the blade base, in which the stresses are much lower than in the blade root, and in which elimination of the aging effects of the material is desirable, do on the other hand undergo a solutioning heat treatment.

The heat treatment method for a turbine blade is suitable in particular for turbine blades which are produced from a superalloy which comprises a crystalline Y phase and a crystalline $\gamma'$ phase. The heating of the blade airfoil and the blade base then takes place at least to a temperature necessary for dissolving the $\gamma'$ phase.

The heat treatment method for turbine blades may be designed in particular as part of a reconditioning and/or repair method for turbine blades.

BRIEF DESCRIPTION OF THE DRAWINGS

Further features, properties and advantages of the present invention emerge from the following description of an exemplary embodiment with reference to the accompanying figures.

DETAILED DESCRIPTION OF INVENTION

Figure 1:
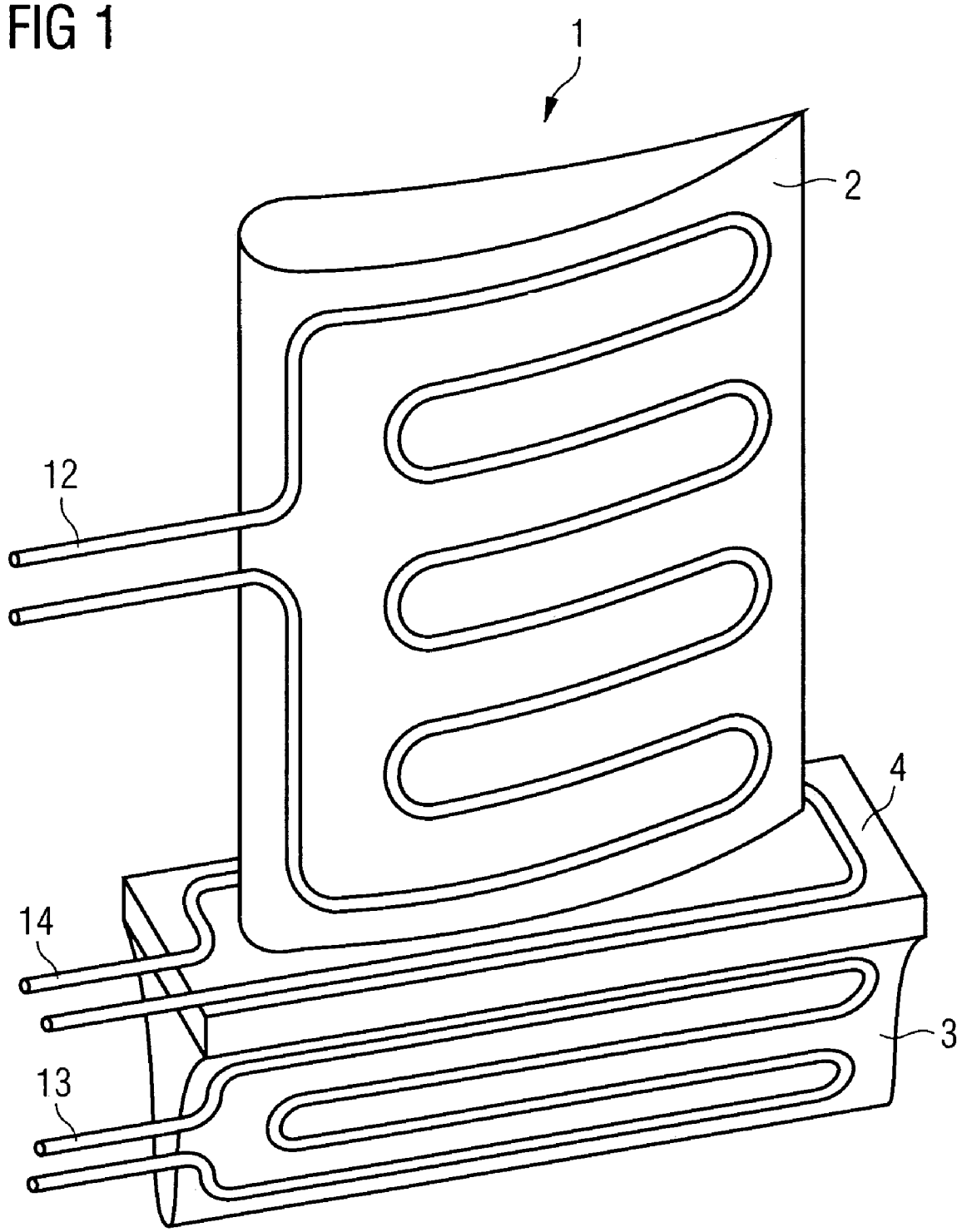
FIG. 1 shows a turbine blade while the heat treatment method according to the invention is being carried out.

In FIG. 1, the turbine blade 1 is represented while the heat treatment method according to the invention is being carried out. The turbine blade 1 comprises a blade airfoil 2, a blade root 3 and also a blade base 4, which connects the blade airfoil 2 to the blade root 3. The turbine blade is produced from a nickel-based monocrystalline superalloy which has a monocrystalline structure with two main crystalline phases, the so-called $\gamma$ phase and the so-called $\gamma'$ phase. Both phases are well-known to a person skilled in the art and are not explained any further at this point.

Figure 2:
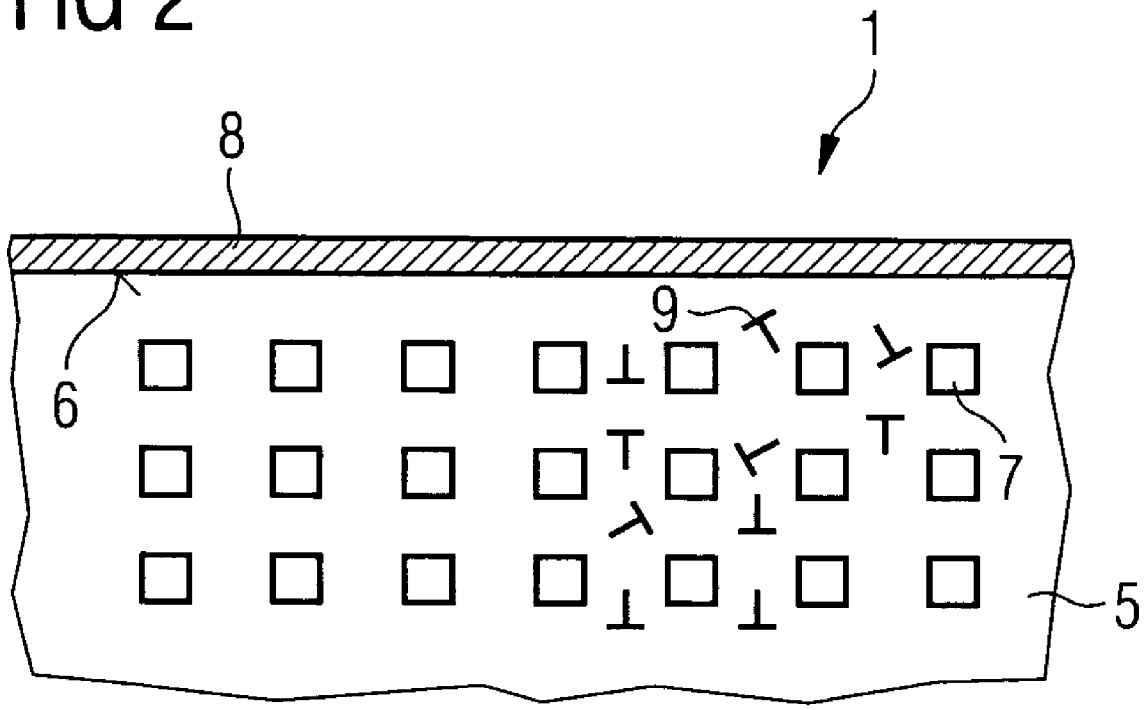
FIG. 2 shows in a schematic representation the structure of the material from which the turbine blade reproduced in FIG. 1 is produced.
Figure 3:
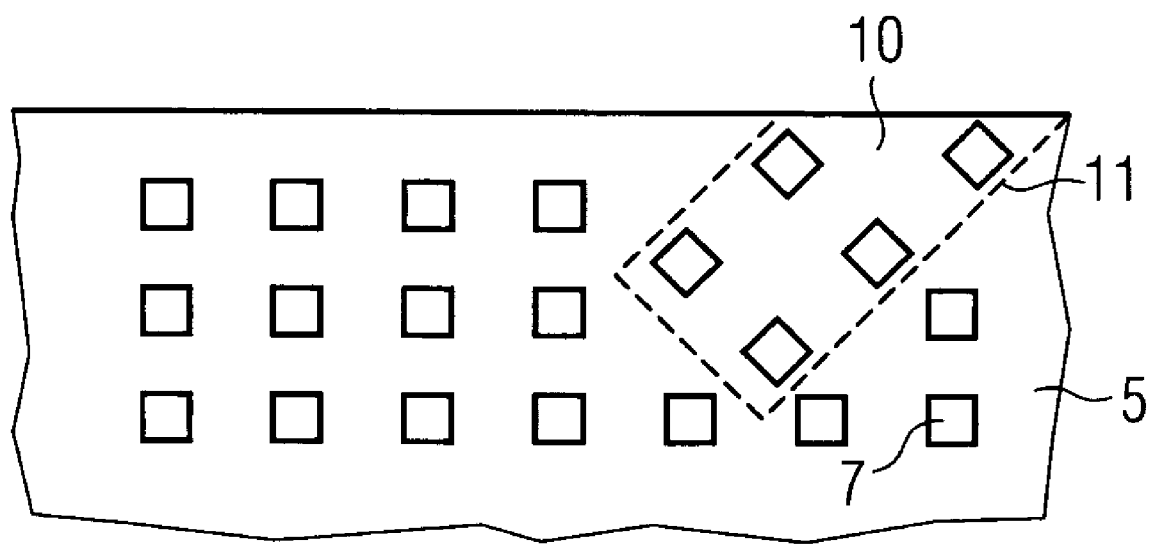
FIG. 3 shows grain boundaries in a material such as that represented in FIG. 2.

The structure of the nickel-based monocrystalline superalloy is schematically represented in FIG. 2. The microstructure of the material with the $\gamma$ phase 5 and the $\gamma'$ phase 7 can be seen. Likewise represented are points of the material at which there are lattice defects, known as imperfections 9. Such imperfections 9 are caused by stresses which occur in the superalloy during the mechanical working of the turbine blade 1. A particularly large number of these imperfections 9 are present in the blade root 3, since this is subjected after casting to mechanical working by means of a grinding process and/or by means of a shot peening process, and strong deformations thereby occur in the blade root 3—in particular close to the surface. A heat treatment in a region with a high density of imperfections would, however, result in recrystallization of the material and so cause misoriented grains 10 and grain boundaries 11 in the material (see FIG. 3).

By contrast with the blade root 3, the blade base 4 and the blade airfoil 2 have far fewer imperfections 9, so that there is significantly less formation of recrystallized grains—and consequently fewer grain boundaries—in a solutioning heat treatment.

During the heat treatment method, the blade airfoil 2 and the blade base 4 are heated to a dissolution temperature which results in at least the $\gamma'$ phase 7 of the superalloy dissolving. The blade root 3, on the other hand, is only heated to a temperature below the dissolution temperature. In the present exemplary embodiment, the temperature gradient between the blade airfoil 2 and the blade base 4 on the one hand and the blade root 3 on the other hand is created by the turbine blade 1 being heated by means of induction heating, separate induction heating coils 12, 13, 14 that are operated differently being used for the blade airfoil 2, blade root 3 and blade base 4 (FIG. 1). In the present exemplary embodiment, the blade base 4 and the blade airfoil 2 can also be heated with a single common induction heating coil, since these two portions of the turbine blade 1 are in each case heated to or above the dissolution temperature for the γ phase 7.

Instead of induction heating, heating may also be performed by means of radiant heaters. In this case, the blade airfoil 2, blade base 4 and blade root 3 are respectively assigned radiant heaters of their own, which are either operated differently or have a different construction, so that as a result they radiate with a different output.

Finally, it is also possible to heat the turbine blade in such a way that the blade airfoil 2, blade root 3 and blade base 4 are exposed to the same heat source. In this case, the blade root 3 is provided with a cooling device or a thermal insulation, in order to reduce the heat absorption by the blade root 3 in comparison with the heat absorption by the blade airfoil 2 and the blade base 4 to the extent that the dissolution temperature for the Y phase is not reached.

It is possible to dispense with reaching the dissolution temperature for the γ phase in the blade region 3 because generally no repairs that necessitate subsequent solutioning heat treatment are necessary on the blade root 3. In the blade airfoil 2 or at the blade base 4, however, such repairs are necessary much more often, since they undergo very much greater wear during the operation of the gas turbine, and accordingly often have to be welded or soldered. Welding and/or soldering processes, however, generally necessitate subsequent solutioning heat treatment.

In an advantageous development, the heat treatment of the turbine blade 1 may take place in an oxidizing atmosphere. In the simplest case, air can be used as the oxidizing atmosphere. Carrying out the heat treatment in an oxidizing atmosphere then leads to formation of an oxide film 8 on the surface 6 of the turbine component 1, suppressing the formation of grains and grain boundaries. Carrying out the heat treatment in an oxidizing atmosphere and the effects of the oxidizing atmosphere are described in detail in US 2003/0062099 A1. Reference is therefore made to this document for further details of the heat treatment in an oxidizing atmosphere.

The heat treatment method presented makes it possible to carry out reconditioning (rejuvenation) on used crystalline or directionally solidified structural components. The repair either of new structural components or of structural components that have already been in operation by methods that require subsequent solutioning heat treatment, for example soldering or welding, is similarly made possible.

The invention claimed is:

1. A method for heat treating a monocrystalline or a directionally solidified material of a structural component, comprising:
   arranging the structural component in proximity to a heat source; and
   heating only:
      a first region of the structural component to or above a dissolution temperature of the component material sufficient to dissolve a crystalline phase of the component material, and
      a second region of the structural component to a temperature below the dissolution temperature of the component material,
   wherein stresses in the first component region do not exceed a predetermined value, and stresses in the second component region exceed the predetermined value, and
   wherein the component is heated by induction heating and different induction heating coils are used for the first and second component regions.

2. The heat treatment method as claimed in claim 1 wherein the first and the second component regions are exposed to the same heat source and the second component region is cooled or insulated.

3. The heat treatment method as claimed in claim 1, wherein the heat treatment is performed in an oxidizing atmosphere.

4. The heat treatment method as claimed in claim 1, wherein the structural component is a turbine blade where:
   the first region corresponds to the blade airfoil and the blade base, and
   the second region corresponds to the blade root.

5. The heat treatment method as claimed in claim 4, wherein the heat treatment is part of a reconditioning or repair method for the turbine blade.

6. The heat treatment method as claimed in claim 4, wherein the turbine blade material is a superalloy comprising a crystalline γ phase and a crystalline γ' phase.

7. The heat treatment method as claimed in claim 6, wherein the blade airfoil and the blade base are heated to a temperature sufficient to dissolve the crystalline γ' phase.

8. A method for heat treating a monocrystalline or a directionally solidified material of a structural component, comprising:
   arranging the structural component in proximity to a heat source; and
   heating only:
      a first region of the structural component to or above a dissolution temperature of the component material sufficient to dissolve a crystalline phase of the component material, and
      a second region of the structural component to a temperature below the dissolution temperature of the component material,
   wherein stresses in the first component region do not exceed a predetermined value, and stresses in the second component region exceed the predetermined value, and
   wherein the component is heated by radiant energy sources and energy sources with different radiant output are used for the first and second component regions.

9. The heat treatment as claimed in claim 8, wherein the first and second component regions are exposed to the same heat source and the second component region is cooled or insulated.

10. The heat treatment method as claimed in claim 8, wherein the heat treatment is performed in an oxidizing atmosphere.

11. The heat treatment method as claimed in claim 8, wherein the structural component is a turbine blade where:
   the first region corresponds to the blade airfoil and the blade base, and
   the second region corresponds to the blade root.

12. The heat treatment method as claimed in claim 11, wherein the heat treatment is part of a reconditioning or repair method for the turbine blade.

13. The heat treatment method as claimed in claim 11, wherein the turbine blade material is a superalloy comprising a crystalline γ phase and a crystalline γ' phase.

14. The heat treatment method as claimed in claim 13, wherein the blade airfoil and the blade base are heated to a temperature sufficient to dissolve the crystalline γ' phase.

* * * * *